United States Patent [19]

Sakai

[11] Patent Number: 4,575,643
[45] Date of Patent: Mar. 11, 1986

[54] FULL-WAVE RECTIFIER CIRCUIT
[75] Inventor: Koichi Sakai, Tokyo, Japan
[73] Assignee: Toko Kabushiki Kaisha, Tokyo, Japan
[21] Appl. No.: 486,926
[22] Filed: Apr. 20, 1983
[30] Foreign Application Priority Data
Apr. 28, 1982 [JP] Japan ................................. 57-72247
[51] Int. Cl.$^4$ ........................ H03K 5/01; G06G 7/12; H02M 7/217
[52] U.S. Cl. ................................. 307/261; 307/494; 328/26; 363/127
[58] Field of Search ............... 307/261, 262, 490, 494, 307/499, 519, 264; 328/26; 363/127; 330/257, 288

[56] References Cited
U.S. PATENT DOCUMENTS
4,158,882 6/1979 Citta ................................. 363/127
4,336,586 6/1982 Lunn ................................. 363/127

Primary Examiner—Stanley D. Miller
Assistant Examiner—Timothy P. Callahan
Attorney, Agent, or Firm—Stevens, Davis, Miller & Mosher

[57] ABSTRACT

In a full-wave rectifier circuit, a sinusoidal signal is applied to a differential amplifier, first and second current mirror circuits obtain outputs from the differential amplifier which are opposite in phase to each other. Outputs of the first and second current mirror circuits are applied respectively to the input and output sides of a third mirror circuit and other outputs of the first and second current mirror circuits are applied respectively to the input and output sides of a fourth mirror circuit. The connecting point of the first and fourth current mirror circuits is connected to the base of a first emitter-follower-connected transistor, while the connecting point of the second and third current mirror circuits is connected to the base of a second emitter-follower-connected transistor. The connecting points are connected to a current source circuit. The first and second emitter-follower-connected transistors have their emitters connected together, to provide a full-wave-rectified output.

3 Claims, 4 Drawing Figures

F I G. 2
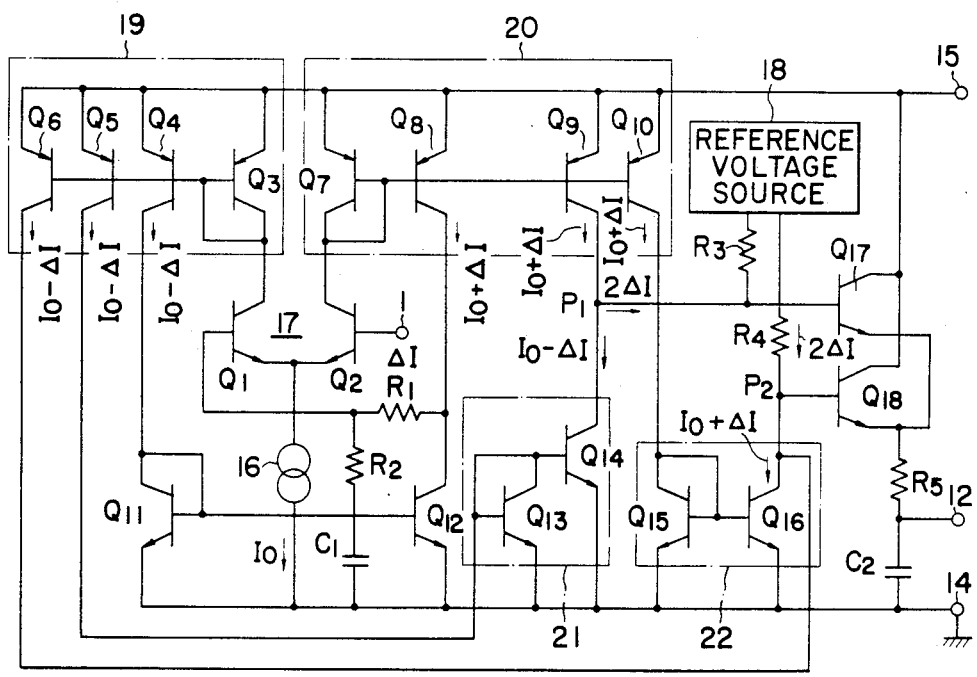

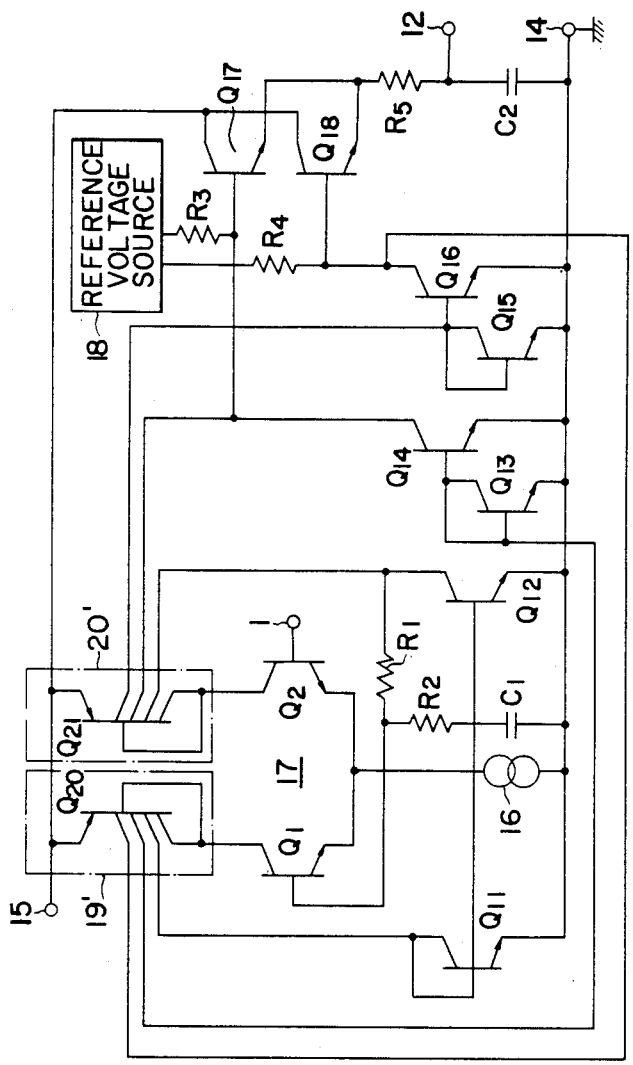
F I G. 3

FULL-WAVE RECTIFIER CIRCUIT

BACKGROUND OF THE INVENTION

This invention relates to a full-wave rectifying circuit which can be readily provided in the form of a semiconductor integrated circuit, and more particularly to an improvement of a conventional full-wave rectifier circuit.

A conventional full-wave rectifier circuit is as shown in FIG. 1. A sine wave signal is applied through a terminal 1 to an amplifier 2, the output of which is applied through a capacitor 8 to a diode 10, so that positive half-cycles of the signal are outputted. On the other hand, the sine wave signal is applied through an inverter 3 and a capacitor 9 to another diode 11, where it is rectified, so that negative half-cycles of the signal are outputted. These two outputs are combined together, thus providing a full-wave rectification output which is smoothed by a smoothing capacitor 13 connected to an output terminal 12.

In the full-wave rectifier circuit, the capacitors 8 and 9 are used to remove DC components. However, it should be noted that it is difficult to integrate the capacitors 8 and 9 in a semiconductor integrated circuit, and accordingly it is necessary to externally connect the capacitors 8 and 9 to the semiconductor integrated circuit. In order to connect the capacitors 8 and 9 to a package including the semiconductor integrated circuit, it is necessary to provide four terminal pins 4 through 7 as shown in FIG. 1. This is not desirable for forming a semiconductor integrated circuit and increases the number of components.

SUMMARY OF THE INVENTION

Accordingly, an object of this invention is to provide a full-wave rectifier circuit which can be readily provided in the form of a semiconductor integrated circuit.

Another object of the invention is to provide a full-wave rectifier circuit in which the capacitors employed in a conventional full-wave rectifier circuit are eliminated, i.e., the number of components is reduced.

A further object of the invention is to provide a full-wave rectifier circuit in which the number of terminal pins of a package including a semiconductor integrated circuit is decreased.

A still further object of the invention is to provide a full-wave rectifier circuit which has less voltage loss and performs rectification efficiently with low supply voltage.

The foregoing objects and other objects as well as the characteristic features of the invention will become more apparent from the following detailed description and the appended claims when read in conjunction with the accompanying drawings.

BRIEF DESCRIPTION OF THE DRAWINGS

In the accompanying drawings:

FIGS. 2, 3 and 4 are circuit diagrams showing examples of a full-wave rectifier circuit according to this invention.

DETAILED DESCRIPTION OF THE INVENTION

Figure 1:
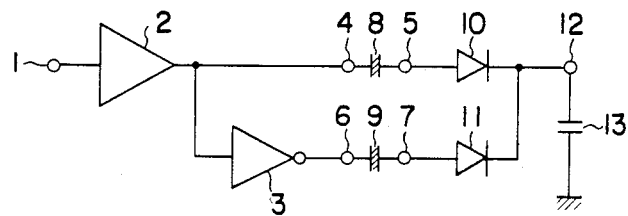
FIG. 1 is a circuit diagram showing a conventional full-wave rectifier circuit.

A first example of a full-wave rectifier circuit according to the invention, as shown in FIG. 2, comprises: a differential amplifier circuit 17 having a differential pair of transistors $Q_1$ and $Q_2$, a current source circuit 16 and diode-connected transistors $Q_3$ and $Q_7$. The transistor $Q_3$ together with transistors $Q_4$, $Q_5$ and $Q_6$ forms a current mirror circuit 19, while the transistor $Q_7$ together with transistors $Q_8$, $Q_9$ and $Q_{10}$ forms a current mirror circuit 20. The collector of the transistor $Q_4$ in the current mirror circuit 19 is connected to the anode of a diode-connected transistor $Q_{11}$, while the collector of the transistor $Q_8$ in the current mirror circuit 20 is connected to the collector of a transistor $Q_{12}$, the transistors $Q_{11}$ and $Q_{12}$ forming a current mirror circuit. The base of the transistor $Q_1$ is connected to the connecting point of resistors $R_1$ and $R_2$. The other terminal of the resistor $R_1$ is connected to the common connecting point of the collectors of the transistors $Q_8$ and $Q_{12}$, while the other terminal of the resistor $R_2$ is grounded through a capacitor $C_1$. These resistors $R_1$ and $R_2$ are feedback resistors for gain control.

Further in FIG. 2, transistors $Q_{13}$ and $Q_{14}$ form a current mirror circuit 21. The transistor $Q_{13}$ is diode-connected. The anode of the transistor $Q_{13}$ is connected to the collector of the transistor $Q_5$ in the current mirror circuit 19, while the collector of the transistor $Q_{14}$ is connected to the collector of the transistor $Q_9$ in the current mirror circuit 20. The collector of transistor $Q_5$ is connected to a biased side of circuit 21, while the collector of transistor $Q_9$ is connected to an output side of circuit 22. Similarly, transistors $Q_{15}$ and $Q_{16}$ form a current mirror circuit 22. The transistor $Q_{15}$ is diode-connected. The anode of the transistor $Q_{15}$ is connected to the collector of the transistor $Q_{10}$ in the current mirror circuit 20, while the collector of the transistor $Q_{16}$ is connected to the collector of the transistor $Q_6$ in the current mirror circuit 19. The collector of $Q_{10}$ is connected to a biased side of circuit 22, while the collector of transistor $Q_6$ is connected to an output side of circuit 22.

The common connecting point $P_1$ of the transistors $Q_9$ and $Q_{14}$ is connected to the base of an emitter-follower-connected transistor $Q_{17}$, while the common connecting point $P_2$ of the transistors $Q_6$ and $Q_{16}$ is connected to the base of an emitter-follower-connected transistor $Q_{18}$. The collectors of the transistors $Q_{17}$ and $Q_{18}$ are connected together and further connected to a terminal 15, while the emitters thereof are connected together and are grounded through a resistor $R_5$ and a capacitor $C_2$. The points $P_1$ and $P_2$ are connected respectively through resistors $R_3$ and $R_4$ to a reference voltage source 18, thus forming a current source circuit. The terminal 15 is connected to a voltage source Vcc. One terminal of the capacitor $C_2$ is grounded through a terminal 14, and the other terminal 12 which is connected to the resistor $R_5$ provides an output which has been subjected to full-wave rectification and has been smoothed.

The operation of the full-wave rectifying circuit thus organized will be described.

A sine wave signal $\Delta I$ superposed on a DC voltage is applied to the input terminal 1, and output currents opposite in phase flow in the current mirror circuits 19 and 20. When a positive half-cycle of the signal is inputted, a current $(I_0 - \Delta I)$ flows in the transistors $Q_4$, $Q_5$ and $Q_6$ in the current mirror circuit 19 (where $I_0$ is the DC component), while a current $(I_0 + \Delta I)$ flows in the transistors $Q_8$, $Q_9$ and $Q_{10}$ of the current mirror circuit 20. The differential outputs of the current mirror circuits 19 and 20 are applied to the current mirror circuits 21 and 22 respectively, with the differential outputs being single-ended.

In the current mirror circuit 21, the current $(I_0-\Delta I)$ flows in the diode-connected transistor $Q_{13}$, and the current through the collector of the transistor $Q_9$ is $(I_0+\Delta I)$. Accordingly, a current $(I_0-\Delta I)$ tends to flow as the collector current of the transistor $Q_{14}$, and therefore a current $(2\Delta I)$ flows as the base current of the transistor $Q_{17}$. As a result, the transistor $Q_{17}$ is rendered conductive, and a current flows in the resistor $R_5$ and is smoothed by the capacitor $C_2$.

On the other hand, in the current mirror circuit 22, the current $(I_0+\Delta I)$ flows in the transistor $Q_{15}$. Therefore, a current $(I_0+\Delta I)$ tends to flow as the collector current of the transistor $Q_{16}$; however, since only the current $(I_0-\Delta I)$ is supplied from the current mirror circuit 19 thereto, a current $(2\Delta I)$ is supplied through the resistor $R_4$. In operation, the transistor $Q_{18}$ remains non-conductive. When the next half-cycle (or the negative half-cycle) is applied to the input terminal 1, the transistor $Q_{17}$ is rendered non-conductive, and the gain of the transistor $Q_{18}$ is increased. Thus, the sine wave signal $\Delta I$ is subjected to full-wave rectification by the alternate operation of the transistors $Q_{17}$ and $Q_{18}$ in the output stage. Alternatively, with small currents supplied through the resistors $R_3$ and $R_4$ to the transistors $Q_{17}$ and $Q_{18}$, the gain of the transistor $Q_{17}$ increases while the gain of transistor $Q_{18}$ decreases in positive half-cycles, and the gain of the transistor $Q_{17}$ decreases while the gain of the transistor $Q_{18}$ increases in negative half-cycles. In other words, the operating points of the transistors $Q_{17}$ and $Q_{18}$ may be so selected that, under the condition that small base currents are applied to the transistors $Q_{17}$ and $Q_{18}$, the gains are maintained higher than predetermined levels.

A second example of the full-wave rectifier circuit according to the invention is as shown in FIG. 3. The second example is similar to the first example except that the current mirror circuits 19' and 20' which are the active load circuits of the differential amplifier 17 in FIG. 2 are made up of multi-collector transistors $Q_{20}$ and $Q_{21}$.

Figure 4:
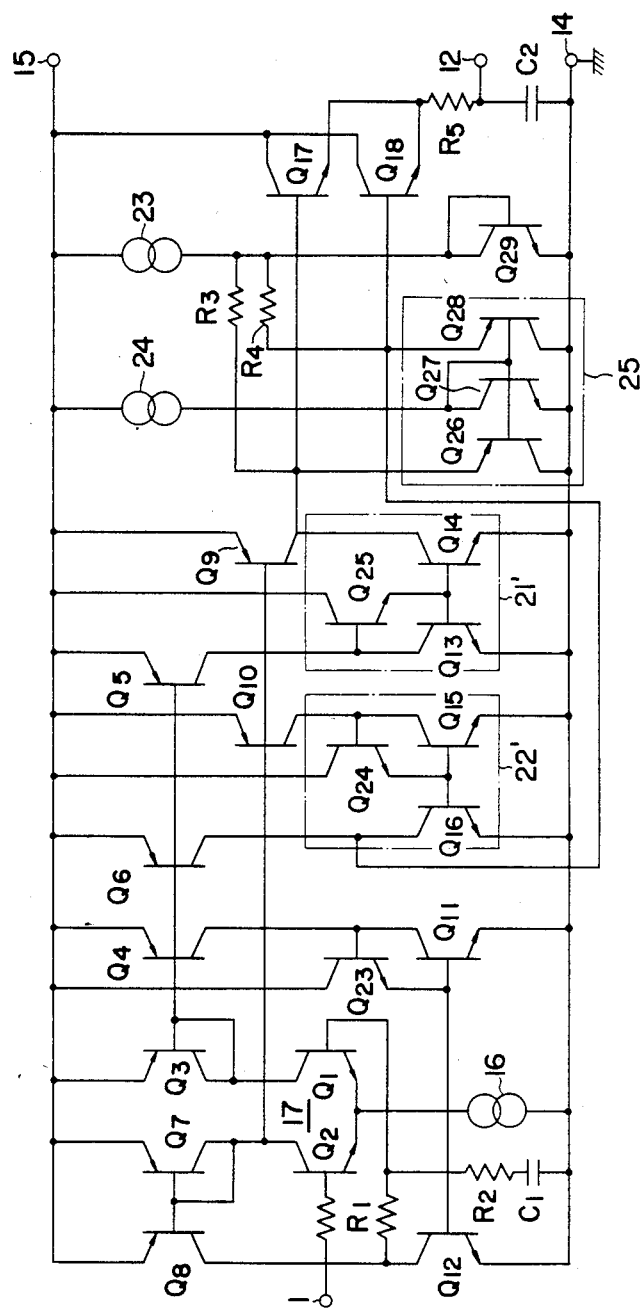

A third example of the circuit of the invention is as shown in FIG. 4. In the third example, the current mirror circuits 21' and 22' additionally include transistors $Q_{25}$ and $Q_{24}$, thus being higher in accuracy, and a current source circuit 23 is provided. Furthermore, another current source circuit 24 is connected to a clipping circuit 25 made up of transistors $Q_{26}$, $Q_{27}$ and $Q_{28}$, so as to protect the transistors $Q_{17}$ and $Q_{18}$. The other arrangement is similar to that in FIG. 3.

As is apparent from the above description, the full-wave rectifier circuit of the invention eliminates the coupling capacitors of the conventional circuit. Therefore, the circuit of the invention can be readily provided in the form of an integrated circuit and the number of components is decreased, which contributes to reduction of the manufacturing cost. Furthermore, in the full-wave rectifier circuit of the invention, it is unnecessary to provide four terminal pins which are essential for provision of the coupling capacitors in the conventional circuit. In addition, in the full-wave rectifier circuit of the invention, unlike the conventional one, it is unnecessary to rectify an input signal with diodes, and therefore the input signal is less in the loss of voltage. Accordingly, the rectification output can be provided efficiently even with a low voltage of several volts.

Furthermore, in the full-wave rectifier circuit of the invention, the detection efficiency can be readily controlled by varying the resistances of the resistors $R_3$ and $R_5$.

What is claimed is:

1. A full-wave rectifier circuit comprising:
    a differential amplifier for receiving a sine wave input signal;
    first and second current mirror circuits for obtaining outputs from said differential amplifier, said outputs comprising a direct current component and a sine wave signal superposed thereon, said outputs being opposite in phase to each other;
    a third current mirror circuit comprising a first transistor, an output of said second current mirror circuit being applied to said first transistor, said first transistor being biased by a bias source which is obtained from an output of said first current mirror circuit; p1 a fourth current mirror circuit comprising a second transistor, an output of said first current mirror circuit being applied to said second transistor, said second transistor being biased by a bias source which is obtained from an output of said second current mirror circuit;
    a first current source connected to a first connecting point between said second and third current mirror circuits;
    a second current source connected to a second connecting point between said first and fourth current mirror circuits;
    a third transistor having a base connected to said first connecting point, said third transistor being emitter-follower-connected; and
    a fourth transistor having a base connected to said second connecting point, said fourth transistor being emitter-follower-connected, collectors of said third and fourth transistors being commonly connected and emitters of said third and fourth transistors being commonly connected; whereby said third and fourth transistors are operative alternatively with a half period of said sine wave input signal to said differential amplifier to obtain a full-wave rectified output from a common connecting point of said emitters of said third and fourth transistors.

2. A circuit as claimed in claim 1, in which each of said first and second current mirror circuits comprise multi-collector transistors.

3. A full-wave rectifier circuit comprising:
    a differential amplifier to which an input signal comprising a sine wave is supplied, an active load of said differential amplifier comprising first and second current mirror circuits having a plurality of output terminals which obtain outputs from said differential amplifier which are opposite in phase to each other,
    an output of said first current mirror circuit is supplied to a biased side of a third current mirror circuit, while an output of said second current mirror circuit is supplied to an output side of said third current mirror circuit,
    an output of said second current mirror circuit is supplied to a biased side of a fourth current mirror circuit, while an output of said first current mirror circuit is supplied to an output side of said fourth current mirror circuit,
    a first connecting point of said first and fourth current mirror circuits being connected to a base of a first transistor which is emitter-follower-connected, a second connecting point of said second and third current mirror circuits being connected to a base of a second transistor which is emitter-follower-connected, said first and second connecting points being connected to a current source circuit, and said first and second transistors having emitters connected together, thereby to provide a full-wave-rectified output.

* * * * *